United States Patent
Huang et al.

(10) Patent No.: US 7,759,210 B2
(45) Date of Patent: *Jul. 20, 2010

(54) METHOD FOR FORMING A MOS DEVICE WITH REDUCED TRANSIENT ENHANCED DIFFUSION

(75) Inventors: Huan-Tsung Huang, Hsin-Chu (TW); Fung Ka Hing, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 529 days.

This patent is subject to a terminal disclaimer.

(21) Appl. No.: 11/644,077

(22) Filed: Dec. 21, 2006

(65) Prior Publication Data

US 2008/0153238 A1    Jun. 26, 2008

(51) Int. Cl.
*H01L 21/336* (2006.01)

(52) U.S. Cl. .................. 438/307; 438/530; 438/545

(58) Field of Classification Search ............... None
See application file for complete search history.

(56) References Cited

U.S. PATENT DOCUMENTS 6,087,209 A * 7/2000 Yeap et al. ............... 438/197
6,368,928 B1 * 4/2002 Wang et al. .............. 438/307
6,660,605 B1 * 12/2003 Liu ......................... 438/307

OTHER PUBLICATIONS

TW2007100974615 Office Action dated Sep. 4, 2009, pp. 1-6.

* cited by examiner

*Primary Examiner*—Zandra Smith
*Assistant Examiner*—Khanh B Duong
(74) *Attorney, Agent, or Firm*—K&L Gates LLP

(57) ABSTRACT

A method for forming a MOS device on a semiconductor substrate includes steps of: forming a gate structure on the semiconductor substrate; implanting ions into the semiconductor substrate for forming one or more lightly doped drain structures adjacent to the gate structure; thermally treating the semiconductor substrate at a first temperature lower than a threshold temperature, below which no substantial transient enhanced diffusion of the lightly doped drain structures occurs, for repairing damage to the semiconductor substrate caused by the ion implantation; forming sidewall spacers to sidewalls of the gate structure on the semiconductor substrate; and forming source and drain regions adjacent to the gate structure in the semiconductor substrate.

14 Claims, 6 Drawing Sheets

METHOD FOR FORMING A MOS DEVICE WITH REDUCED TRANSIENT ENHANCED DIFFUSION

BACKGROUND

The present invention relates generally to semiconductor processing technology, and more particularly to a method for forming a metal-oxide-semiconductor (MOS) device with reduced transient enhanced diffusion.

As the gate width of MOS device reduces along with the size of semiconductor technology, the channel length between its source and drain is shortened. The shortening in channel length has led to severe problems such as hot carrier effect, which can degrade device performance and cause device breakdown. To remedy such problems, alternative drain structures such as lightly doped drain (LDD) structures have been developed. LDD structures act as parasitic resistors and absorb some of the energy within a MOS device, thereby reducing maximum energy in the channel region. This reduction in energy reduces the generation of the hot electrons that can hinder the performance of the MOS device.

The LDD structure is typically formed by implanting ions into one or more predetermined areas in a semiconductor substrate. During the implantation process, defects and damage may be caused to the semiconductor substrate. If the defects and damage are not repaired, the boundaries of the various doped regions, such as the source/drain regions, LDD regions and pocket implant areas, may expand significantly due to an effect called transient enhanced diffusion (TED), which typically occurs when the semiconductor substrate is annealed above a certain temperature after the ion implantation. For example, when forming sidewall spacers, the semiconductor substrate is thermally treated at a temperature ranging from 600 to 800 degrees Celsius. This temperature induces the TED effect that causes the undesired boundary shifting to the doped regions. As a result, the parasitic capacitance among various junctions of the doped regions is increased, thereby degrading the performance of the MOS device.

In order to eliminate the TED effect, a high temperature annealing process known as a rapid thermal annealing process (RTA or RTP) is typically performed immediately after the formation of the LDD structures to repair the damages caused by the ion implementation. However, by applying the conventional RTP to repair implant damage and reduce the TED effect, a new problem with thermal diffusion is introduced. During the RTP, the semiconductor substrate is thermally treated at a temperature higher than 800 degrees Celsius. This high temperature will cause thermal diffusion, which increases the junction depth of the doped regions in the substrate. This increased junction depth will hinder the performance of the MOS device.

Desirable in the art of semiconductor processing technology are methods for forming LDD structures that can suppress the TED effect and reduce thermal diffusion to improve performance of the MOS device.

SUMMARY

The present invention discloses a method for forming a MOS device on a semiconductor substrate. In one embodiment of the present invention, the method includes steps of: forming a gate structure on the semiconductor substrate; implanting ions into the semiconductor substrate for forming one or more lightly doped drain structures adjacent to the gate structure; thermally treating the semiconductor substrate at a first temperature lower than a threshold temperature, below which no substantial transient enhanced diffusion of the lightly doped drain structures occurs, for repairing damage to the semiconductor substrate caused by the ion implantation; forming sidewall spacers to sidewalls of the gate structure on the semiconductor substrate; and forming source and drain regions adjacent to the gate structure in the semiconductor substrate.

The construction and method of operation of the invention, however, together with additional objects and advantages thereof will be best understood from the following description of specific embodiments when read in connection with the accompanying drawings.

DESCRIPTION

This invention is related to a method for forming a MOS device with reduced TED effect. The following merely illustrates various embodiments of the present invention for purposes of explaining the principles thereof. It is understood that those skilled in the art of semiconductor processing technology will be able to devise various equivalents that, although not explicitly described herein, embody the principles of this invention.

References in the specification to "one embodiment," "an embodiment," "an example embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to implement such feature, structure or characteristic in connection with other embodiments whether or not explicitly described.

Figure 1:
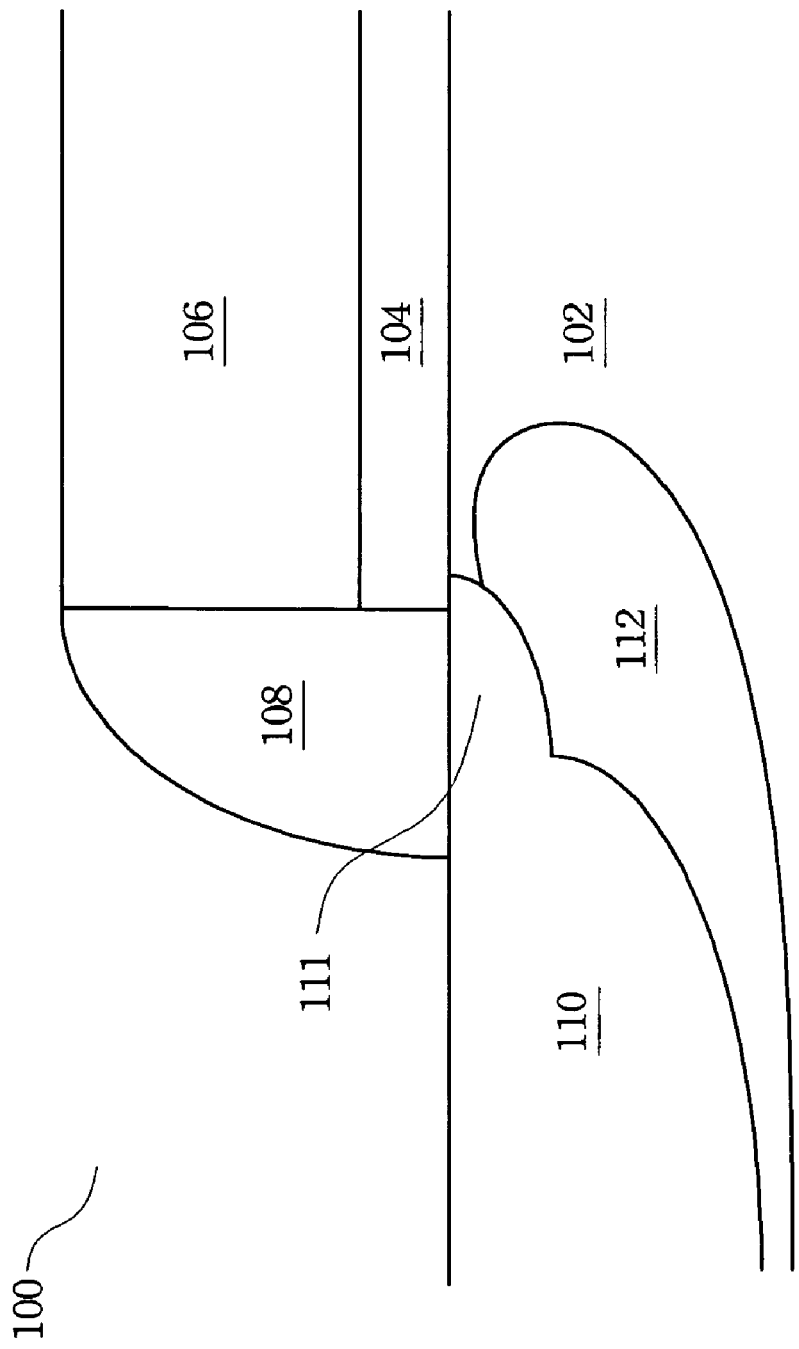
FIG. 1 illustrates a partial cross-sectional diagram of a MOS device implemented with a LDD structure that has been treated by the conventional RTP.

FIG. 1 illustrates a partial cross-sectional diagram of a MOS device 100 implemented with a LDD structure that has been treated by the conventional processing method. The partial cross-sectional diagram only shows a portion of the NMOS device 100 comprising a semiconductor substrate 102, a gate oxide 104, a poly-silicon gate 106, a sidewall spacer 108, a source/drain region 110, a LDD structure 111 and a pocket implant area 112. The LDD structure 111 is formed by implanting ions into the semiconductor substrate 102 before the formation of the sidewall spacer 108. During the ion implantation, the semiconductor substrate 102 is often damaged, such that it is particularly susceptible to the TED effect.

In order to eliminate the TED effect, an RTP, which often requires a temperature higher than 800 degrees Celsius, is usually performed during the processes of forming the sidewall spacer 108, in order to repair the damage caused by the ion implantation when forming the LDD structure 111. One drawback of this conventional processing method is that the RTP step would cause various doped regions to further diffuse into the semiconductor substrate 102, thereby changing the electric characteristics of the MOS device 100 and degrading its performance. For example, after the RTP, the junction of the pocket implant area 112, which is a lightly doped area around the source/drain region 110 for mitigating the short channel effect, extends laterally into the channel region under the gate oxide 104. This significantly increases the parasitic capacitance between the source/drain region 110 and the pocket implant region 112, and also reduces the effective area of the channel region. As a result, the performance of the MOS device 100 is significantly degraded.

Figure 2:
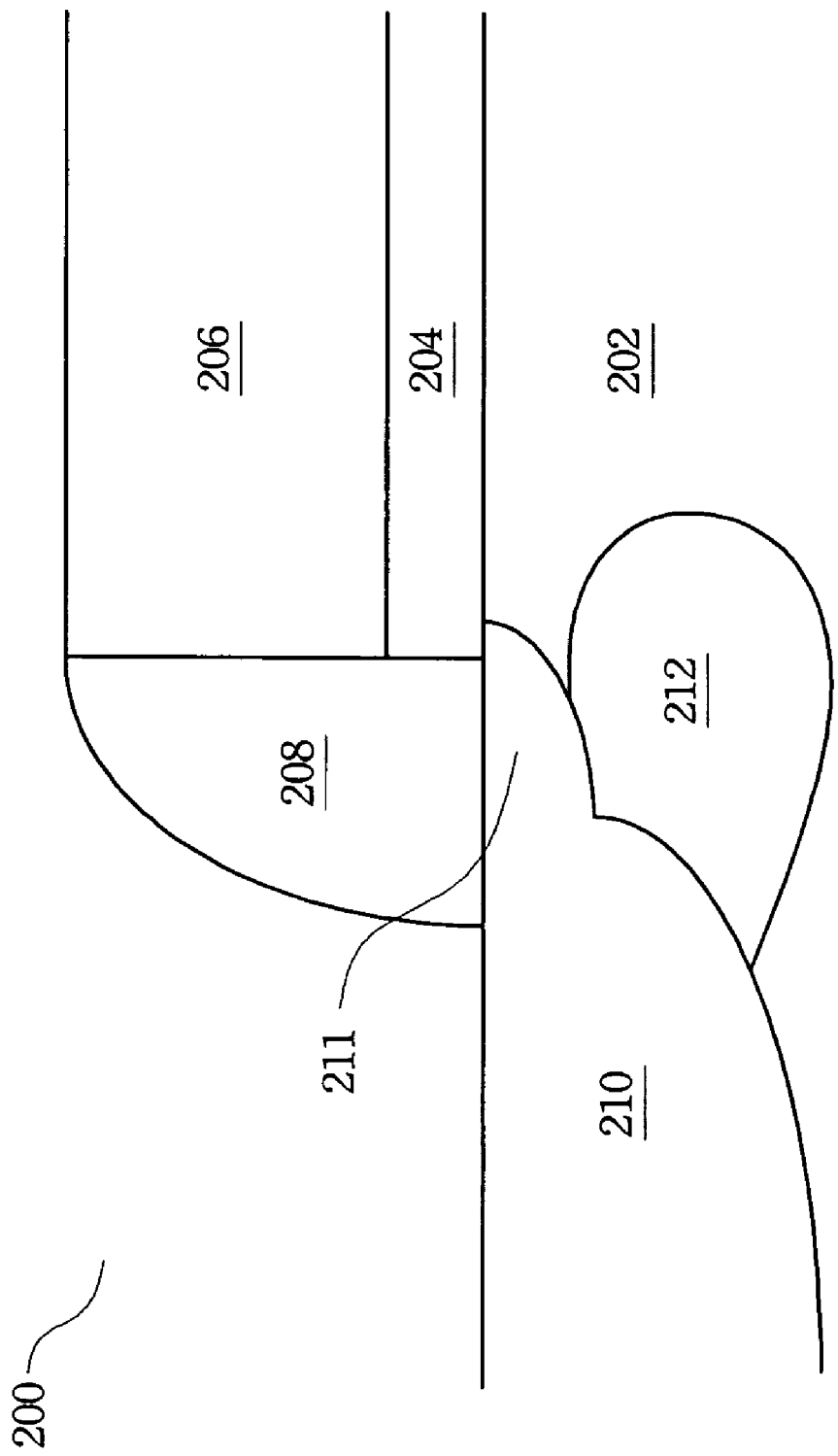
FIG. 2 illustrates a partial cross-sectional diagram of a MOS device implemented with a LDD structure that has been thermally treated in accordance with one embodiment of the present invention.

FIG. 2 illustrates a partial cross-sectional diagram of a MOS device 200 implanted with a LDD structure that has been treated by the proposed low temperature annealing the process in accordance with one embodiment of the present invention. The partial cross-sectional diagram only shows a portion of the NMOS device 200 comprising a semiconductor substrate 202, a gate dielectric 204, a gate electrode 206, a sidewall spacer 208, a source/drain region 210, a LDD structure 211, and a pocket implant area 212. The gate dielectric 204 and the gate electrode 206 are collectively referred to as the "gate structure." Before the formation of the sidewall spacer 208, the LDD structure 211 is treated at a temperature lower than a threshold temperature, below which no substantial TED of the lightly doped drain structures would occur, until the damage caused by the ion implantation to the semiconductor substrates 202 is substantially repaired. As understood by people skilled in the art of semiconductor processing technology that no substantial TED would occur when the semiconductor substrate 202 is treated at a temperature below approximate 600 degrees Celsius. In this embodiment, the LDD structure 211 is thermally treated at a temperature approximately between 450 and 600 degrees Celsius for about 10 to 240 minutes. At this temperature range, the TED effect can be avoided, while the damage caused by the ion implantation during the formation of the LDD structure 211 can be repaired. As a result, the various doped regions, such as the source/drain region 210, the LDD structure 211 and the pocket implant area 212, will not further diffuse substantially into the semiconductor substrate 202 due to any subsequent annealing process.

As shown in the drawing, after the formation of the sidewall spacer 208, the junction of the pocket implantation area 212 remains fairly aligned with an outer edge of the LDD structure 211. Thus, the parasitic capacitance per unit area between the pocket implant area 212 and the source/drain region 210 is significantly reduced and the channel region under the gate dielectric 204 can remain substantially unaffected. As a result, the performance of the MOS device 200 is improved as opposed to the MOS device 100 (shown in FIG. 1) produced by the conventional processing method.

FIGS. 3A-3J illustrate cross-sectional diagrams detailing a fabrication process of a MOS device in accordance with one embodiment of the present invention.

FIGS. 3A to 3D demonstrate the initial processing steps of the NMOS device. The process begins in FIG. 3A by defining an active region of a semiconductor substrate 300 using photolithography between isolation structures that are not shown in the figure. A layer of gate dielectric 302 is formed above the semiconductor substrate 300 in FIG. 3B, before a layer of conductive material 304, such as poly-silicon and metal, is deposited thereabove in FIG. 3C. The conductive layer 304 and the gate dielectric 302 are then defined photolithographically in FIG. 3D, thereby allowing it to be used as the gate structure of the NMOS device.

Figure 3A:
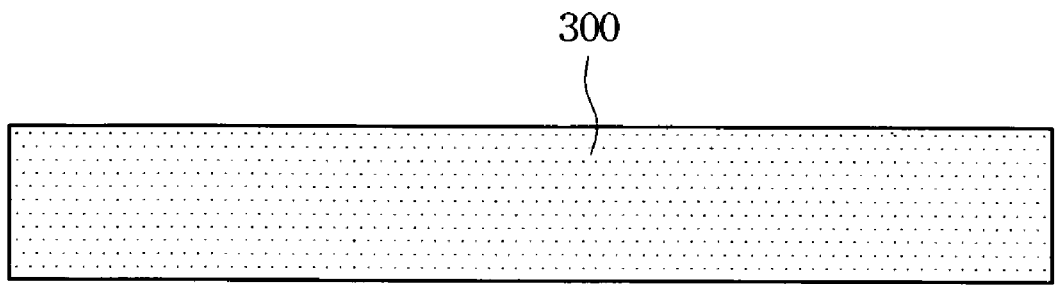
FIGS. 3A-3J illustrate cross-sectional diagrams detailing a fabrication process of a MOS device in accordance with one embodiment of the present invention.
Figure 3B:
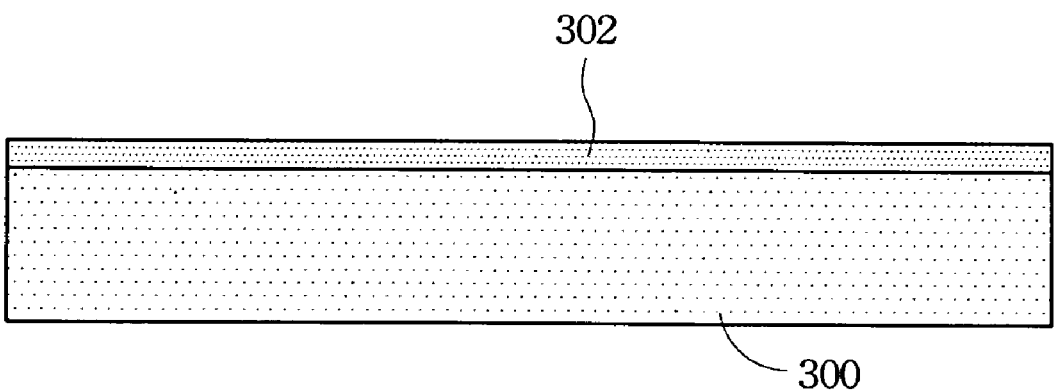
Figure 3C:
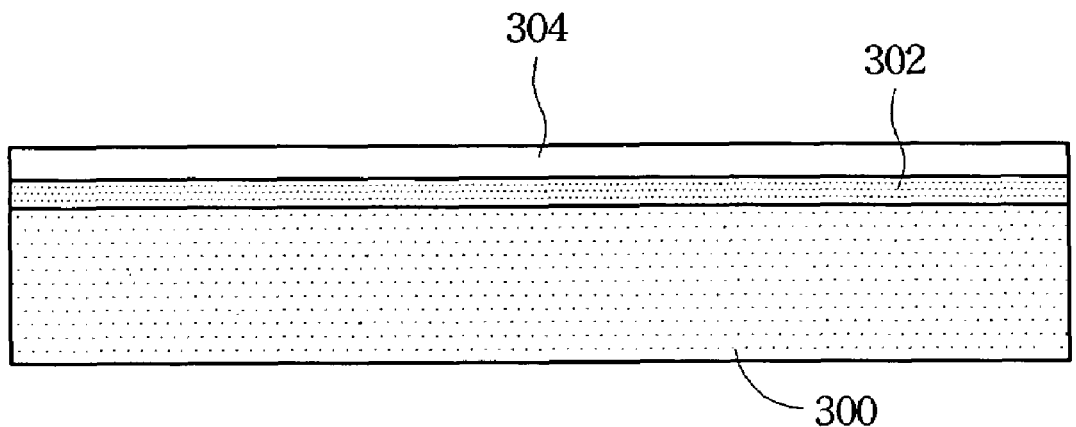
Figure 3D:
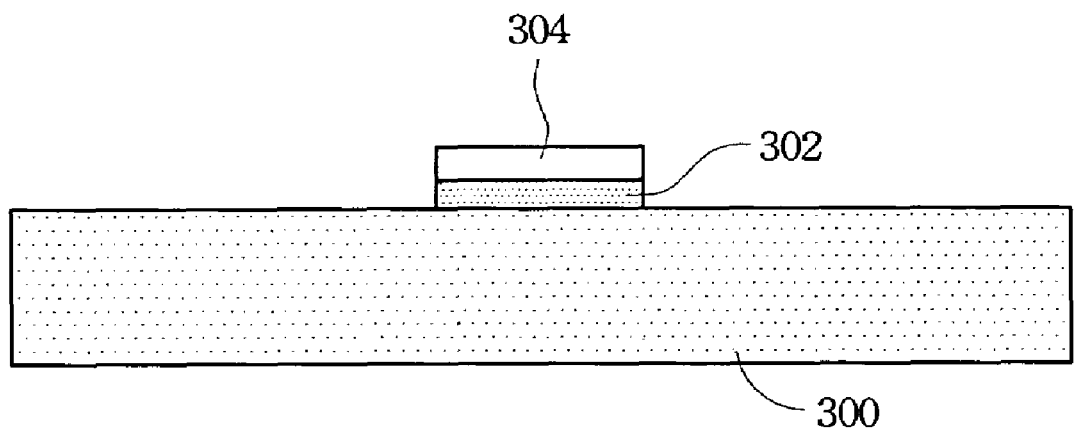
Figure 3E:
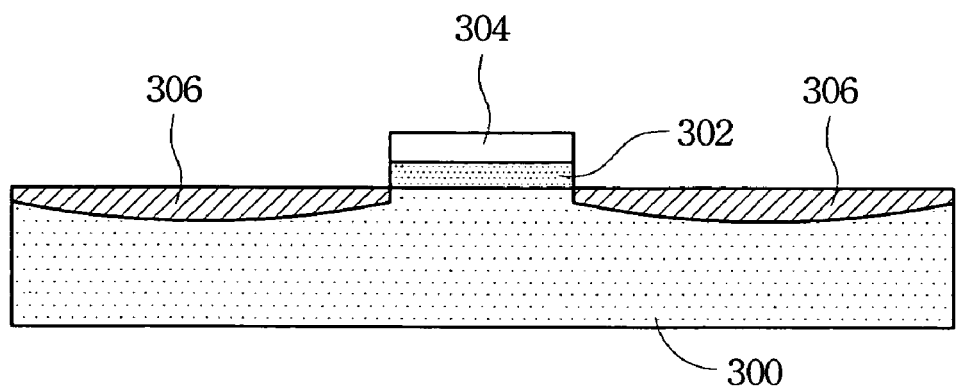

In FIG. 3E, a set of LDD structures 306 is formed adjacent to the gate structure in the semiconductor substrate 300 by ion implantation. The semiconductor substrate 300 is then treated by the proposed low temperature annealing process as described above to repair the damage caused by the ion implantation. The dosage of the halo implant for the LDD structure 306 can be reduced since the proposed low temperature annealing process allows the LDD structure 306 to have a more confined profile. This means that the LDD structure 306, with its reduced dosage, can provide the NMOS device with substantially similar levels of the reverse short channel effect (RSCE) and the threshold voltage as those produced by conventional processing methods.

Figure 3F:
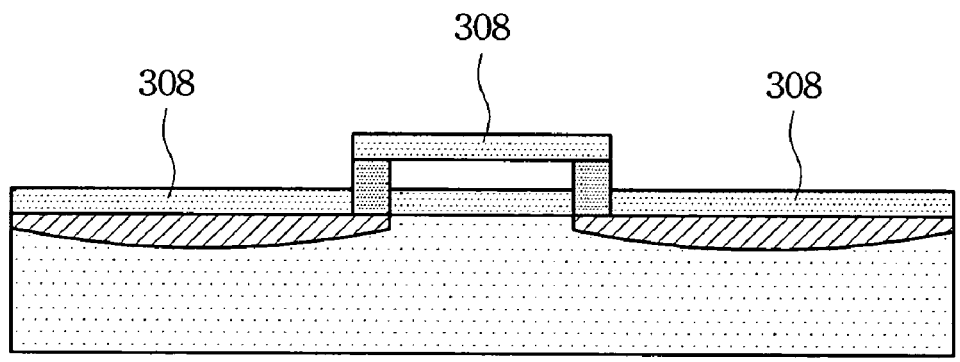
Figure 3G:
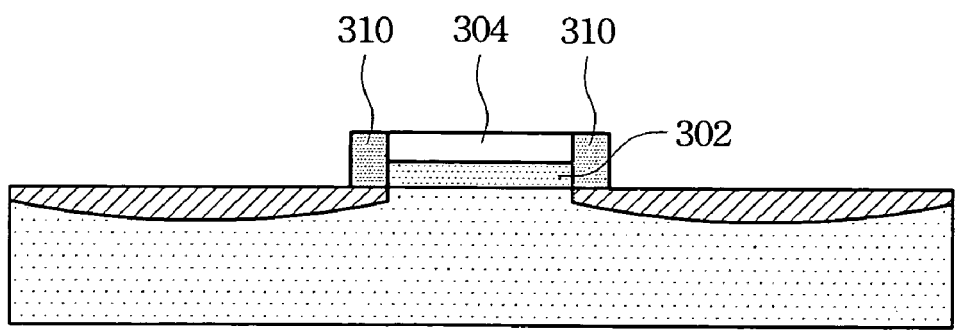
Figure 3H:
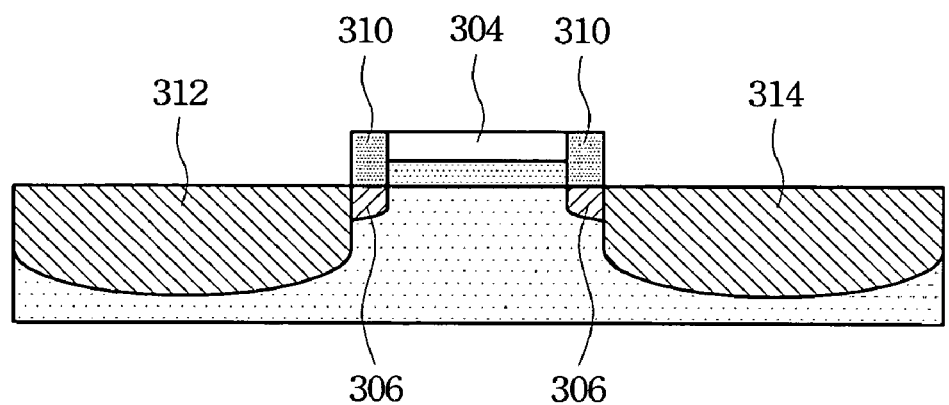
Figure 3I:
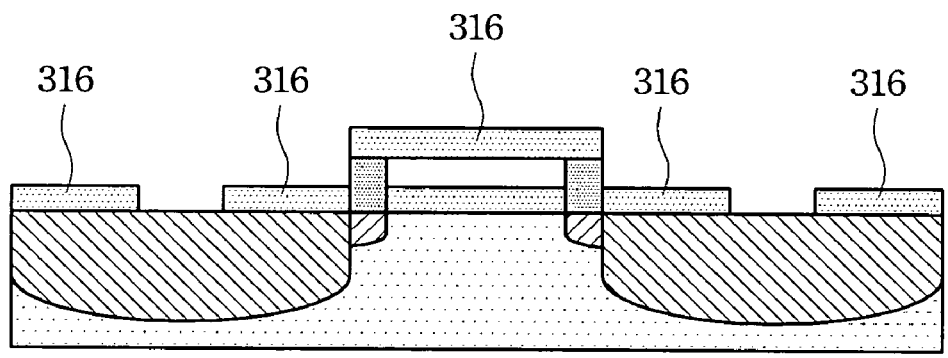
Figure 3J:
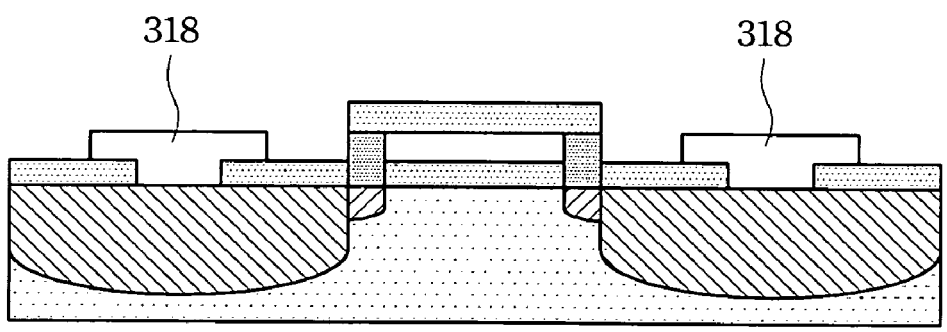

After the low temperature annealing process, a layer of dielectric 308 is deposited over the semiconductor substrate in FIG. 3F. Most of the dielectric layer 308 will then be etched away in FIG. 3G to leave a pair of sidewall spacers 310 next to the gate electrode, which came from the remaining conductive layer 304 and the gate dielectric 302. The sidewall spacers 310 can provide protection for the gate electrode 304 and the gate dielectric 302 against the contamination of environment. In FIG. 3H, source/drain regions 312 and 314 are implanted on the two sides of the gate electrode 304 that are not covered by the gate dielectric 302 and the sidewall spacers 310. It is noted that the naming of the source/drain regions 312 and 314 is interchangeable, depending on how it is connected in a circuit. Since the area covered by the sidewall spacers 310 was not affected by the source/drain regions 312 and 314, portions of the LDD structure 306 on both sides of the gate electrode still remain. In FIG. 3I, another layer of dielectric 316 is formed above the entire device with one or more contact windows defined above the source/drain regions. With the contact windows defined, a conductive structure 318 can be formed to create the contacts for the source/drain regions of the device as shown in FIG. 3J.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a MOS device on a semiconductor substrate, comprising:

forming a gate structure on the semiconductor substrate;

implanting ions into the semiconductor substrate for forming one or more lightly doped drain structures adjacent to the gate structure;

thermally treating the semiconductor substrate at a first temperature lower than a threshold temperature for approximately 10 to 240 minutes, below which no substantial transient enhanced diffusion of the lightly doped drain structures occurs, for repairing damage to the semiconductor substrate caused by the ion implantation, wherein the threshold temperature is about 600 degrees Celsius;

forming sidewall spacers to sidewalls of the gate structure on the semiconductor substrate; and forming source and drain regions adjacent to the gate structure in the semiconductor substrate.

2. The method of claim 1, wherein the semiconductor substrate is thermally treated at the first temperature, approximately between 450 and 600 degrees Celsius.

3. The method of claim 1, wherein the semiconductor substrate is thermally treated until the damage caused by the ion implantation to the semiconductor is repaired.

4. The method of claim 1, wherein the sidewall spacers are formed at a second temperature higher than the threshold temperature.

5. The method of claim 1 further comprising forming one or more pocket implant areas under the source and drain regions.

6. A method for forming a MOS device on a semiconductor substrate, comprising:
   forming a gate structure on the semiconductor substrate;
   implanting ions into the semiconductor substrate for forming one or more lightly doped drain structures adjacent to the gate structure;
   thermally treating the semiconductor substrate at a first temperature lower than 600 degrees Celsius for approximately 10 to 240 minutes for repairing damage caused by the ion implantation to the semiconductor substrate and for avoiding a transient enhanced diffusion, of the lightly doped drain structures;
   forming sidewall spacers to sidewalls of the gate structure on the semiconductor substrate, wherein the sidewall spacers are formed at a second temperature higher than about 600 degrees Celsius; and
   forming source and drain regions adjacent to the gate structure in the semiconductor substrate.

7. The method of claim 6, wherein the semiconductor substrate is thermally treated at the first temperature approximately between 450 and 600 degrees Celsius.

8. The method of claim 6 wherein the semiconductor substrate is thermally treated until the damage caused by the ion implantation to the semiconductor is repaired.

9. The method of claim 6, wherein no substantial transient enhanced diffusion of the lightly doped drain structures occurs at a temperature below 600 degrees Celsius.

10. The method of claim 6 further comprising forming one or more pocket implant areas under the source and drain regions.

11. A method for forming a MOS device on a semiconductor substrate, comprising:
    forming a gate structure on the semiconductor substrate;
    implanting ions into the semiconductor substrate for forming one or more lightly doped drain structures adjacent to the gate structure;
    thermally treating the semiconductor substrate at a first temperature lower than 600 degrees Celsius for approximately 10 to 240 minutes in order to repair damage caused by the ion implantation to the semiconductor substrate;
    forming sidewall spacers to sidewalk of the gate structure on the semiconductor substrate at a second temperature higher than about 600 degrees Celsius; and
    forming source and drain regions adjacent to the gate structure in the semiconductor substrate.

12. The method of claim 11, wherein the semiconductor substrate is thermally treated at the first temperature approximately between 450 and 600 degrees Celsius.

13. The method of claim 11, wherein no substantial transient enhanced diffusion of the lightly doped drain structures occurs at a temperature below 600 degrees Celsius.

14. The method of claim 11 further comprising forming one or more pocket implant areas under the source and drain regions.

\* \* \* \* \*